(12) United States Patent
Anzai et al.

(10) Patent No.: US 7,276,856 B2
(45) Date of Patent: Oct. 2, 2007

(54) LIGHT EMITTING DEVICE AND DRIVE METHOD THEREOF

(75) Inventors: Aya Anzai, Tsukui Kanagawa (JP); Mitsuaki Osame, Kanagawa (JP); Yoshifumi Tanada, Kanagawa (JP); Keisuke Miyagawa, Kanagawa (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/321,992

(22) Filed: Dec. 29, 2005

(65) Prior Publication Data

US 2006/0108936 A1 May 25, 2006

Related U.S. Application Data

(60) Division of application No. 11/147,527, filed on Jun. 8, 2005, which is a continuation of application No. 10/376,366, filed on Feb. 27, 2003, now Pat. No. 7,023,141.

(30) Foreign Application Priority Data

Mar. 1, 2002 (JP) ............................. 2002-055840

(51) Int. Cl.
*G09G 3/10* (2006.01)
(52) U.S. Cl. .................... 315/169.3; 345/76; 345/80
(58) Field of Classification Search ............. 315/160, 315/167, 169.3; 345/206, 76, 80, 211, 212, 345/77, 82, 84
See application file for complete search history.

(56) References Cited

U.S. PATENT DOCUMENTS

| 5,552,678 | A | 9/1996 | Tang et al. ............... 315/169.3 |
| 5,990,629 | A * | 11/1999 | Yamada et al. .......... 315/169.3 |
| 6,175,345 | B1 | 1/2001 | Kuribayashi et al. ......... 345/76 |
| 6,373,455 | B1 | 4/2002 | Kuribayashi et al. ......... 345/76 |
| 6,380,689 | B1 | 4/2002 | Okuda ...................... 315/169.3 |
| 6,548,960 | B2 | 4/2003 | Inukai ...................... 315/169.3 |

(Continued)

FOREIGN PATENT DOCUMENTS

EP 1 103 946 5/2001

(Continued)

*Primary Examiner*—Thuy Vinh Tran
(74) *Attorney, Agent, or Firm*—Cook, Alex, McFarron, Manzo, Cummings & Mehler, Ltd.

(57) ABSTRACT

The reliability of an EL element is enhanced while the increase of the electric power consumption is suppressed. It becomes possible that in a SES drive, the reverse bias is applied to the EL element driven at a constant electric current. Moreover, the application of the reverse bias is performed by varying only the counter electrode, and thus withstand voltage of TFT and the increase of the electric power consumption due to the increase of voltage of the gate signal line drive circuit, which becomes a problem when changing greatly the electric current supplying line, can be suppressed. Furthermore, the reduction of the electric power consumption can also be achieved while the enhancement of the reliability is secured by making the reverse bias smaller than the forward bias. Moreover, the increase of the number of electric sources can be also suppressed by making the potential be in common with the potential of the electric source of the source signal line drive circuit or the gate signal line drive circuit, at the time when the reverse bias is applied.

22 Claims, 9 Drawing Sheets

U.S. PATENT DOCUMENTS

| | | | |
|---|---|---|---|
| 6,690,034 B2 | 2/2004 | Fujimoto et al. | 257/72 |
| 6,731,276 B1 * | 5/2004 | Ishizuka | 345/211 |
| 6,756,740 B2 | 6/2004 | Inukai | 315/169.3 |
| 6,791,129 B2 | 9/2004 | Inukai | 257/208 |
| 6,864,863 B2 * | 3/2005 | Kasai | 345/39 |
| 2001/0035849 A1 | 11/2001 | Kimura et al. | 345/76 |
| 2002/0000576 A1 | 1/2002 | Inukai | 257/202 |
| 2002/0042152 A1 | 4/2002 | Yamazaki et al. | 438/4 |
| 2002/0047581 A1 | 4/2002 | Koyama | 315/169.3 |
| 2003/0062545 A1 | 4/2003 | Yamazaki et al. | 257/200 |
| 2003/0160745 A1 | 8/2003 | Osame et al. | 345/82 |
| 2003/0174106 A1 | 9/2003 | Tanada et al. | 345/83 |

FOREIGN PATENT DOCUMENTS

| | | |
|---|---|---|
| JP | 8-180972 | 7/1996 |
| JP | 2001-109432 | 4/2001 |
| JP | 2001-142413 | 5/2001 |
| JP | 2001-222255 | 8/2001 |
| JP | 2001-343933 | 12/2001 |

* cited by examiner

- 201: SOURCE SIGNAL LINE
- 202: GATE SIGNAL LINE FOR WRITING
- 203: GATE SIGNAL LINE FOR BLANKING
- 204: TFT FOR SWITCHING
- 205: TFT FOR BLANKING
- 206: TFT FOR DRIVING
- 207: EL ELEMENT
- 208: ELECTRIC CURRENT SUPPLYING LINE
- 209: COUNTER ELECTRODE

| 501 | : D-FLIP FLOP | 503b | : SECOND LATCH CIRCUIT |
| 502 | : SHIFT REGISTER | 504 | : LEVEL SHIFTER |
| 503a | : FIRST LATCH CIRCUIT | 503a | : BUFFER |

| 601 | : D-FLIP FLOP |
| 602 | : SHIFT REGISTER |
| 603 | : LEVEL SHIFTER |
| 604 | : BUFFER |

700 : SUBSTRATE
701 : SOURCE SIGNAL LINE
702 : GATE SIGNAL LINE FOR WRITING
703 : GATE SIGNAL LINE FOR BLANKING
704 : CURRENT SUPPLYING LINE
705 : SWITCHING TFT
706 : BLANKING TFT
707 : DRIVING TFT
708 : PIXEL ELECTRODE
711 : SEPARATION WALL
712 : ORGANIC CONDUCTIVE FILM
713 : ORGANIC THIN FILM
714 : OPPOSITE ELECTRODE

801 : D-FLIP FLOP
802 : SHIFT REGISTER
803 : LEVEL SHIFTER
804 : BUFFER
805 : SELECTION CIRCUIT

LIGHT EMITTING DEVICE AND DRIVE METHOD THEREOF

This application is a divisional of U.S. application Ser. No. 11/147,527 filed on Jun. 8, 2005 which is a continuation of U.S. application Ser. No. 10/376,366 filed on Feb. 27, 2003, which is now U.S. Pat. No. 7,023,141.

BACKGROUND OF THE INVENTION

1. Field of the Invention

The present invention relates to a light emitting element and a method for driving a light emitting device manufactured by forming thin-film transistors (hereinafter abbreviated as TFTs) on a substrate. Further, the present invention relates to electronic apparatuses using the light-emitting device as a display unit.

Within this specification, as a representative example of the light emitting element, an Electro Luminescence (EL) element will be used. Further, the EL element includes the ones which utilize emission of light from singlet excitons (fluorescence) and the ones which utilize the emission of light from triplet excitons (phosphorescence).

2. Description of the Related Art

In recent years, light-emitting devices having EL elements have been vigorously developed as self light emitting elements. Unlike the liquid crystal display devices, the light-emitting device is of self light emitting type. The EL element has a structure in which an EL layer is held between a pair of electrodes (anode and cathode), the EL layer being, usually, of a laminated-layer structure. Typically, there can be exemplified a laminated-layer structure of "positive hole-transporting layer/light-emitting layer/electron-transporting layer". This structure features a very high light-emitting efficiency, and the EL display devices that have now been studied and developed have almost all been employing this structure.

There can be further exemplified a structure in which a positive hole-injecting layer, a positive hole-transporting layer, a light-emitting layer and an electron-transporting layer are laminated in this order on the anode, or a structure in which the positive hole-injecting layer, the positive hole-transporting layer, the light-emitting layer, the electron-transporting layer and the electron-injecting layer are laminated thereon this order. The light-emitting layer may further be doped with a fluorescent pigment or the like pigment.

In this specification, the layers provided between the cathode and the anode are all referred generally as an EL layer. Therefore, the above positive hole-injecting layer, positive hole-transporting layer, light-emitting layer, electron-transporting layer and electron-injection layer are all included in the EL layer.

A predetermined voltage is applied across the pair of electrodes (both electrodes) holding the EL layer of the above structure therein, whereby the carriers are recombined in the light-emitting layer to thereby emit light. At this time, the luminance of the EL element is in proportion to a current flowing to the EL element.

The light-emitting devices can include those of the passive matrix type and those of the active matrix type. Here, the devices of the active matrix type are suited for the applications where a high-speed operation is required for the increase in the number of pixels accompanying high resolution and displaying moving images.

As a method of driving an EL element, there are a method of driving at a constant voltage, in which a certain voltage is applied to the EL element; and a method of driving at a constant current, in which a certain electric current is flowed to the EL element. In the method of driving at a constant voltage, the electric resistance of an EL element changes depending upon the temperature variation and the amount of electric current flowing to the EL element also changes. Moreover, the electric resistance of the EL element increases, and the amount of electric current flowing to the EL element decreases, due to the changes over time. Since the brightness of the EL element is in proportion to the electric current, the brightness also changes along with those of the electric current. Hence, as a method of driving an EL element, it may be desirable to employ the method of driving at a constant electric current.

However, besides the change of electric resistance of the EL element, such deterioration occurs as the brightness of the EL element being lowered due to the changes over time, even if a certain electric current is flowed. Particularly, the lowering of the brightness due to the deterioration of the EL element at the time of initial lighting, which is called an "initial deterioration," is significant.

Hence, for the purpose of suppressing the deterioration of the EL element and enhancing the reliability, there is a method of applying the reverse bias to the EL element.

As for a reverse bias application voltage, it has been disclosed in JP-A-08-180972 gazette, that preferably the reverse bias voltage is made larger than or equal to the forward bias voltage.

Moreover, as for a method of driving an active matrix type light emitting device, there is a digital time gradation method which is not easily influenced by the variation of the characteristics of the TFT for driving. That is a method in which each pixel is configured with two transistors, a TFT for driving and a TFT for switching, one frame period is divided into an address (writing) period and a sustain (light emitting) period, and the gradation is controlled by the sum of the lengths of the time for emitting the light.

Moreover, there is a digital time gradation method in which poly-gradation display with a high precision can be realized by utilizing three transistors, specifically, a TFT for driving, a TFT for switching and a TFT for blanking. In the present specification, a digital time gradation method using these three transistors for each pixel is defined as SES (Simultaneous Erase Scan) drive. It should be noted that concerning with this SES drive, the detail of it has been disclosed in JP-A-2001-343933 gazette.

It is contemplated that the reverse bias is applied by the SES drive at the time when an EL element is driven at a constant electric current. In an active matrix type light emitting device, in order to drive the EL element at the constant electric current, the TFT for driving and the EL element are put in series and in order to operate the TFT for driving in the saturation region, a high-voltage is required.

Furthermore, in the case where the reverse bias voltage is made larger than the forward bias voltage, if an electrode in which the capacitance loading is large is changed, such a problem occurs as increase of the consumption of the electric power. Moreover, it is considered that malfunctions indicated in the followings may occur depending upon the reverse bias application method. The pixel configuration in the case where the foregoing SES drive method is performed is shown in FIG. 2. Moreover, the reason will be described with reference to FIG. 2.

Each pixel has a source signal line 201, agate signal line for writing 202, a gate signal line for blanking 203, a TFT for switching 204, a TFT for blanking 205, a TFT for driving 206, an EL element 207 and an electric current supplying line 208, one of EL elements 207 is connected to a source electrode of the TFT for driving 206 or a drain electrode (pixel electrode), and the other is connected to a counter electrode 209.

Here, the TFT for switching 204 and the TFT for blanking 205 are N-channel type TFTs, the TFT for driving 206 is a P-channel type TFT, and in the EL element 207, the side connected to the TFT for driving 206 is made an anode, the side connected to the counter electrode 209 is made a cathode. For the purpose of clarifying the description, each potential is shown within the parenthesis ( ) as an example. However, these potentials are solely examples, when it is driven by the following methods, it may be appropriately set at the desired potential.

First, a pulse (8V) by which the TFT for switching 204 is turned ON is inputted into the gate signal line for writing 202, the TFT for switching 204 is turned ON, and a picture signal outputted into the source signal line 201 is applied to a gate electrode of the TFT for driving 206. Here, since the TFT for driving 206 is a P-channel type TFT, when the picture signal is at H level (6 V), it is turned OFF, and when it is at L level (0 V), it is turned ON.

Subsequently, by turning the TFT for driving 207 ON, the electric current flows through the EL element 207 from the electric current supplying line 208 (5 V) towards the counter electrode 209, and the light emits. The TFT for driving 206 is operated in the saturation region. Moreover, when the TFT for driving 206 is turned OFF, the electric current does not flow into the EL element 207, it becomes in a non-light emitting state.

Subsequently, a pulse (8V) for turning the TFT for blanking ON is inputted into the gate signal line for blanking 203, and the TFT for blanking 205 is turned ON. The potential of the electric current supplying line 208 is inputted to the gate electrode of the TFT for driving 206 by turning the TFT for blanking 205 ON, the voltage between the gate and the source of the TFT for driving 206 becomes 0, the TFT for driving 206 is turned OFF. Therefore, the EL element 207 becomes in a non-light emitting state.

Here, the reverse bias period is provided in a non-light emitting period, and consider the case where the reverse bias is applied to the EL element 207. In the case where the reverse bias is applied by greatly changing the potential of the electric current supplying line 208, the potential at the time when the gate signal line for writing 202 is turned OFF must be increased.

For example, when the potential of the electric current supplying line 208 was greatly changed (5 V→−22 V), the TFT for blanking 205 is turned ON and the potential of the gate electrode of the TFT for driving 206 becomes the potential of the electric current supplying line 208 (−22 V) since the potential of the gate electrode of the TFT for blanking 205 (−2 V) is higher than the potential of the electric current supplying line 208 by the portion of more than the threshold of the TFT for blanking 205. Therefore, the TFT for driving 206 is also turned ON, the potential of the pixel electrode becomes the potential raised from the potential of the gate electrode of the TFT for driving 206 by the portion of the threshold voltage of the TFT for driving 206 (about −20 V). Therefore, as a result, the reverse bias voltage (about 10 V) is applied to the EL element.

However, when paying attention to the TFT for switching 204 at this time, the TFT for switching 204 is turned ON since the potential of the gate electrode (−2 V) is higher than the potential of the gate electrode of the TFT for driving 206 (about −20 V) by the portion of more than the threshold of the TFT for switching 204. Specifically, the electric current supplying line 208 and the source signal line 201 are shorted while sandwiching the TFT for switching 204, the TFT for blanking 205. In this way, in order to prevent the TFT which originally should not be turned ON from being turned ON, the potential at the time when the gate signal line for writing 202 must be further lowered (about −24 V). However, in this case, the increase of the consumption of electric power of the gate driver becomes a problem by increasing the voltage amplitude of the signal as well as the uncertainty is generated on the withstand voltage of the TFT.

Moreover, by changing greatly the reverse bias voltage, the other section which has capacitive coupling to the section for changing the voltage (electric current supplying line 208 and the like) is changed by the voltage, being influenced at the time when the reverse bias is applied. Due to this, it is also considered that the transistor which should be turned OFF is turned ON, or the consumption of electric power are increased by charging and discharging the moved electric charge and so forth.

Moreover, by increasing the reverse bias voltage (10V) more than the forward bias voltage (8V), the changes of the potential of the electric current supplying line 208 (27 V) further become larger, even if the deterioration of the EL element is suppressed, the demerit such as the increase of the consumption of electric power and the like cannot be avoided.

Hence, the present invention aims at suppressing the increase of the consumption of electric power and enhancing the reliability of the EL element, and proposes an alternate current drive method in which the reverse bias is applied to the EL element driving at the constant electric current in the SES drive.

SUMMARY OF THE INVENTION

As for a method of driving an EL element at a constant electric current in the SES drive, one example has been described in Japanese Patent Application No. 2002-025065. In this SES drive, the reverse bias application period is provided in a non-light emitting period.

As a method of applying the reverse bias, it is characterized in that the electrode on the opposite side of the electrode (counter electrode) directly connected to the drain electrode or the source electrode of the TFT for driving while sandwiching the EL element is changed.

Furthermore, the consumption of electric power is reduced by making the reverse bias voltage smaller than the forward bias voltage. Even at this time, the effect of enhancing the reliability by utilizing the reverse bias is obtained.

Moreover, the increase of the number of electric sources within the panel can be prevented by making the electric source at the time when the reverse bias is applied to the counter electrode be in common with the driver electric source within the panel. Here, the forward bias voltage is gradually increased from the light emitting initiation voltage in order to drive the EL element at the constant electric current.

Hereinafter, the configuration of the present invention will be described.

A method of driving a light emitting device of the present invention is, a method of driving a light emitting device having a plurality of pixels in which light emitting elements are provided and performing the expression of the gradation by controlling the difference between the light emitting times of the foregoing light emitting elements, the foregoing method is characterized in that it comprises, a first step of performing the writing to the foregoing pixel of a picture signal, a second step of making the foregoing light emitting element in a light emitting state or in a non-light emitting state-based on the foregoing written picture signal, a third step of forcibly making the foregoing light emitting element into a non-light emitting state after the foregoing second step, and a fourth step of applying the reverse bias voltage $V_2$ whose polarity is inversed between the first electrode and the second electrode of the foregoing light emitting element with respect to the forward bias voltage $V_1$ applied between the first electrode and the second electrode of the foregoing light emitting element at the time when the foregoing light emitting element emits, and the device is made so as to hold the expression of $|V_1| \geq |V_2|$.

A method of driving a light emitting device of the present invention is, a method of driving a light emitting device having a plurality of pixels in which light emitting elements are provided and performing the expression of the gradation by controlling the difference between the light emitting times of the foregoing light emitting elements, the foregoing method is characterized in that, one frame period has n pieces (n is a natural number, 2<n) of subframe periods, the foregoing subframe period has an address period in which the picture signal is written into the pixel and a sustain period in which the display is performed by controlling the light emitting or non-light emitting of the foregoing light emitting element based on the picture signal written in the foregoing pixel, respectively, m pieces (m is a natural number, 0<m≦n−1) of subframe periods selected from n pieces of the foregoing subframe periods have m pieces of reset periods in which the writing of the reset signal is performed into the pixel after the foregoing sustain period has been completed and do not overlap with each other, and m pieces of blanking periods in which the state of the foregoing light emitting element is forcibly made into a non-light emitting state in a line in which a reset signal is written and the periods do not overlap each other, respectively, k pieces (k is a natural number, 0<k≦m) of subframe periods selected from the foregoing m pieces of subframe periods have k pieces of the reverse bias application periods in which at the time when the light emitting element emits, the reverse bias voltage $V_2$ whose polarity is inversed is applied with respect to the forward bias voltage $V_1$ applied between the first electrode and the second electrode of the foregoing light emitting element and the periods do not overlap with each other, respectively, The foregoing address period, the foregoing sustain period, the foregoing reset period, the foregoing blanking period, the foregoing reverse bias period and the foregoing reverse bias application period have a period in which one portion of these periods is overlapped with each other, respectively, And the device is made so as to hold the expression of $|V_1| \geq |V_2|$.

In the above-described method of driving a light emitting device of the present invention, the foregoing method is characterized in that, in a period in which the display of the screen is performed by the procedure that the foregoing light emitting element emits or becomes in a non-light emitting state, the light emitting element to which the foregoing forward bias voltage is applied is driven at the constant electric current.

In the above-described method of driving a light emitting device of the present invention, the foregoing method is characterized in that, the changing from the foregoing forward bias voltage to the foregoing reverse bias voltage is performed by changing only the counter electrode of the foregoing light emitting element.

BRIEF DESCRIPTION ON THE DRAWINGS

DESCRIPTION OF THE PREFERRED EMBODIMENTS

Embodiment 1

Figure 1A:
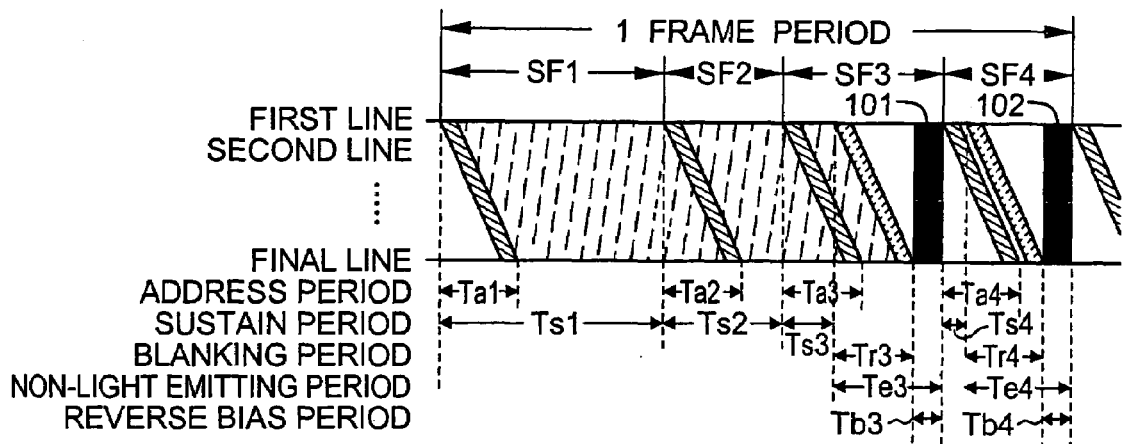
FIGS. 1A to 1E are diagrams for illustrating one Embodiment of the present invention.

A pixel configuration and its driving method for the purpose of solving the problem will be described with reference to FIG. 1D below.

The respective pixels have a source signal line 111, a gate signal line for writing 112, a gate signal line for blanking 113, a TFT for switching 115, a TFT for blanking 116, a TFT for driving 117, an EL element 118 and an electric current supplying line 114, respectively, one side of the EL element is connected to a source electrode of the TFT for driving 117 or a drain electrode (pixel electrode), the other side has been connected to the counter electrode 119. Moreover, a switch 120 is connected to the counter electrode 119, at the time when the forward bias is applied, it can be switched to the potential of Vc1 and at the time when the reverse bias is applied, it can be switched to the potential of Vc2.

Here, the TFT for switching 115, the TFT for blanking 116 are N-channel type TFTs, the TFT for driving 117 is a P-channel type TFT, and in the EL element 118, the side connected to the TFT for driving 117 is made as an anode, the side connected to the counter electrode 119 is made as a cathode. Moreover, for the purpose of making the description clearer, examples of voltage values are shown within the parenthesis ( ). However, these potentials are solely examples, when it is driven by the following methods, it may be appropriately set at the desired potential.

According to the picture signal, in the period in which the forward bias is applied to the light emitting EL element 118, the potential of the counter electrode 119 becomes the potential of Vc1 (−10 V) by the switch 120. First, a pulse is inputted into the gate signal line for writing 112, it becomes H level (8V), the TFT for switching 115 is turned ON, the picture signal outputted to the source signal line 111 is applied to the gate electrode of the TFT for driving 117. Here, since the TFT for driving 117 is a P-channel type TFT, at the time when the picture signal is at H level (6 V), it is turned OFF, and at the time when it is at L level (0 V), it is turned ON.

Subsequently, by turning the TFT for driving 117 ON, the electric current flows through the EL element 118 from the electric current supplying line 114 (5 V) towards the counter electrode 119 whose potential is at Vc1 (−10 V), and the light emits. The TFT for driving 117 operates in the saturation region. Moreover, when the TFT for driving 117 is turned OFF, the electric current does not flow into the EL element 118, it becomes in a non-light emitting state.

Subsequently, a pulse is inputted into the gate signal line for blanking 113, it becomes H level (8 V), and the TFT for blanking 116 is turned ON. The potential of the electric current supplying line 114 (5V) is inputted to the gate electrode of the TFT for driving 117 by turning ON the TFT for blanking 116, the voltage between the gate and the source of the TFT for driving 117 becomes 0, the TFT for driving 117 is turned OFF. Hence, the EL element 118 becomes in a non-light emitting state.

In the case where the reverse bias period is applied to the EL element 118, the potential of the counter electrode 119 is switched to the potential of Vc2 (10 V) by the switch 120. This potential may be made in common with the potential of the source signal line drive circuit or the gate signal line drive circuit. Here, it is made in common with the electric source of the gate signal line drive circuit. The capacitance between the counter electrode 119 (cathode) and the pixel electrode (anode) is large, the potential of the pixel electrode is raised to the direction of plus by the change (20 V) at the time when the potential of the counter electrode 119 is switched from Vc1 to Vc2. At this time, since the potential of the gate electrode of the TFT for driving 117 is maintained at the voltage (5 V) at the time of blanking, the potential of the pixel electrode becomes a value (about 7 V) that the threshold voltage (about 2 V) of the TFT for driving 117 has been added to the potential (5V) of the gate electrode of the TFT for driving 117, whereby the reverse bias voltage (about 3 V) is applied to the EL element 118.

By the above-described operation, the reverse bias voltage is applied to the EL element, thereby being capable of suppressing the initial deterioration of the EL element which has been considered as a problem. Furthermore, at the time when the reverse bias voltage is applied, only the counter electrode is changed, in the TFT for driving and the TFT for blanking connected to the electric current supplying line, the voltage between the gate and the source is not influenced at all. Hence, this does not increase significantly the consumption of electric power of the gate signal line drive circuit.

Embodiment 2

Figure 1B:
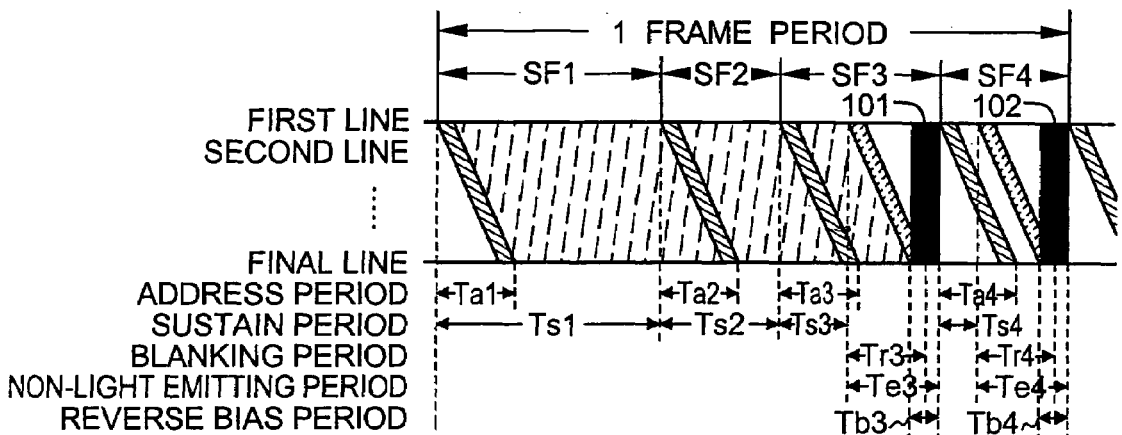
Figure 1C:

A pixel configuration and its driving method for the purpose of solving the problem will be described with reference to FIG. 1E below.

The respective gate signal lines for writing have a switch 121, at the time when the forward bias is applied, Vc3 is selected and at the time when the reverse bias is applied, Vc4 is selected. At the time when Vc3 was selected, an output pulse from a shift register of the gate driver is outputted to the gate signal line for writing, and at the time when Vc4 was selected, the potential at which the TFT for switching becomes in an ON state is outputted to the gate signal line for writing of all lines at the same time.

The operation at the time when the forward bias is applied is the same with that of Embodiment 1. At the time when the reverse bias is applied, the potential of the counter electrode is switched to Vc2 (8V). The electric source of Vc2 may be made in common with the electric source of the source signal line drive circuit or the gate signal line drive circuit. Here, it is made in common with the electric source of the source signal line drive circuit Next, the source signal line drive circuit is operated so that all of the potentials of the source signal line become L level (0 V).

Moreover, the potentials of the gate signal lines for writing of all lines are made Vc4 (10 V) by the switch 121, whereby the TFTs for switching are all turned ON at the same time, the potential of the gate electrode of the TFT for driving is the same with the potential of the source signal line, that is, L level (0 V). Hence, the TFT for driving is turned ON, the potential of the pixel electrode becomes the potential of the electric current supplying line (5 V), and the reverse bias voltage (3 V) is applied.

According to the present Embodiment, compared to Embodiment 1, the potential of the pixel electrode at the time when the reverse bias is applied is lowered by the portion of the threshold voltage of the TFT for driving, whereby in the case where the same reverse bias voltage is applied, the potential of the counter electrode at the time when the reverse bias is applied can be lowered by the portion of the threshold voltage of the TFT for driving, and the consumption of electric power can be reduced.

EXAMPLES

Hereinafter, Examples of the present invention will be described.

Example 1

Figure 9:
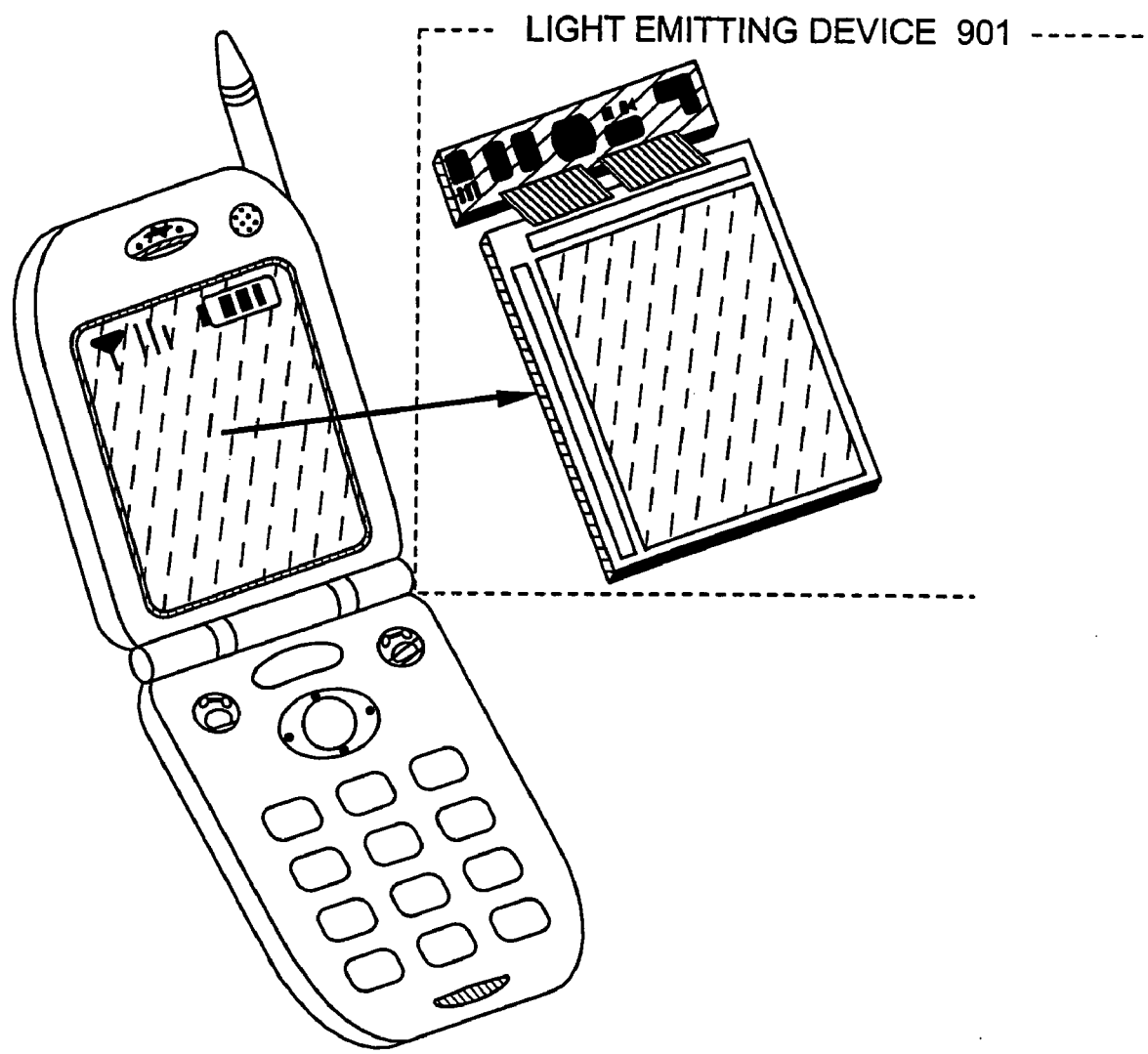
FIG. 9 is a drawing showing an example of a light emitting device self-contained in an electronic apparatus.

As shown in FIG. 9, in the case where the light emitting device is used as a display part of an electronic apparatus of a cellular phone or the like, it is self-contained in a form of a light emitting device 901. Here, the light emitting device 901 indicates the form in which a panel and a substrate on which a LSI for processing a signal for driving the light emitting device, a memory and the like have been mounted are connected with each other.

Figure 4A:
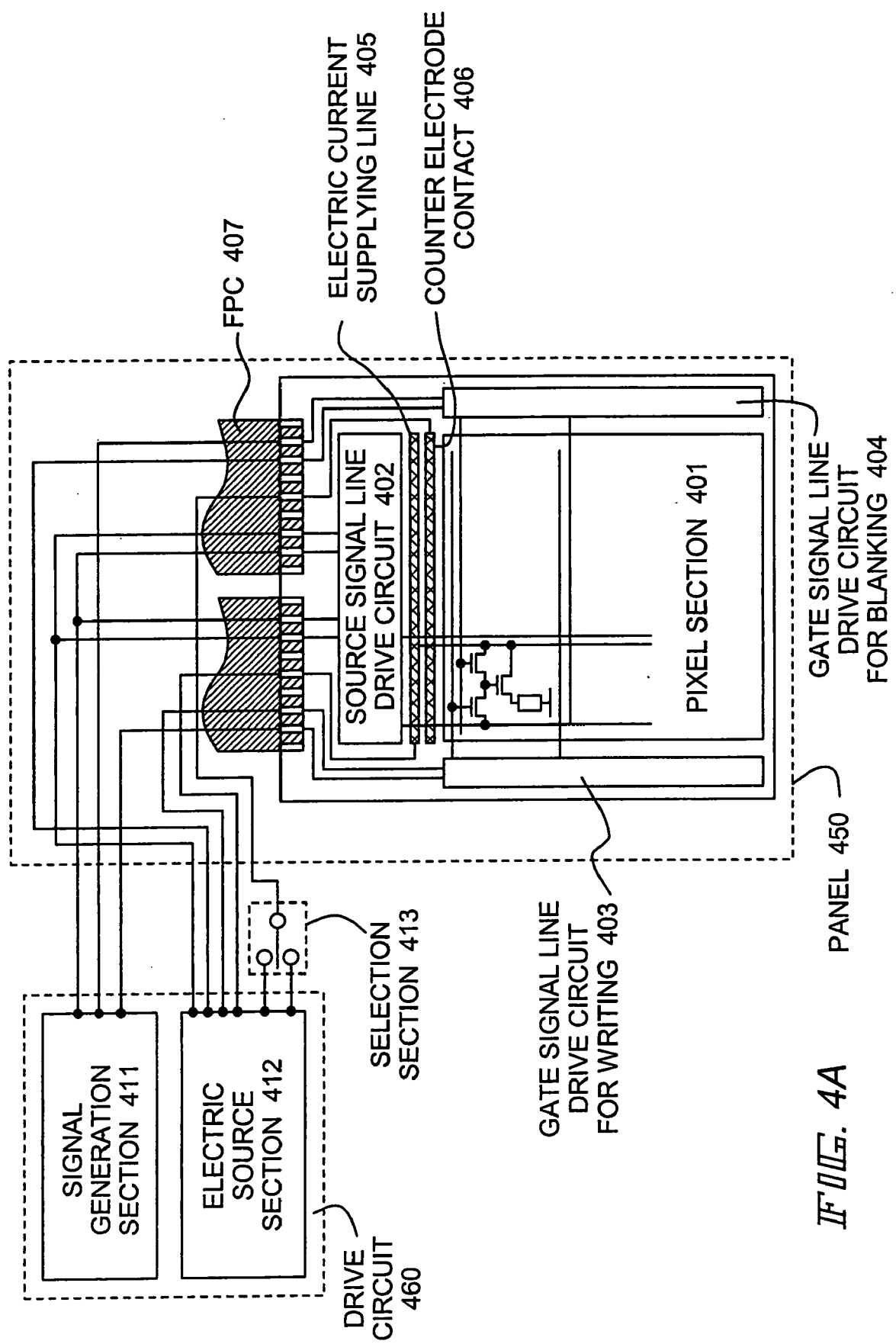
FIGS. 4A and 4B are block diagrams showing the configuration of a light emitting device.

FIG. 4A shows a block diagram of the light emitting device 901. The light emitting device 901 has a panel 450 and a drive circuit 460.

The drive circuit 460 has a signal generation section 411 and an electric source section 412. The electric source section 412 generates electric sources having a plurality of the desired voltage values, respectively, from the electric source supplied by the external battery and supplies to the source signal line drive circuit, the gate signal line drive circuit, a light emitting element, the signal generation section 411 and the like, respectively. An electric source, a picture signal and a synchronization signal are inputted into the signal generation section 411, a clock signal and the like for driving the source signal line drive circuit and the gate signal line drive circuit are generated as well as the conversions of a variety of signals are performed so as to be capable of processing in the display device 450. Moreover, a selection section 413 for switching the input electric source between the drive circuit 460 and the panel 450 is provided.

Moreover, the panel 450 is configured with a pixel section 401, a source signal line drive circuit 402, a gate signal line drive circuit for writing 403, a gate signal line drive circuit for blanking 404, an electric current supplying line 405, a counter electrode contact 406, a FPC 407 and the like on the substrate. At the center section of the substrate, the pixel section 401 is arranged, and in the peripheral section, the source signal line drive circuit 402, the gate signal line drive circuit for writing 403, the gate signal line drive circuit for blanking 404 and the like are arranged. The supply of the signal and electric source for driving the source signal line drive circuit 402, the gate signal line drive circuit for writing 403, the gate signal line drive circuit for blanking 404 is performed through the FPC 407 by the drive circuit 460. The counter electrode of the EL element is formed on the whole surface of the pixel section 401, the potential is given through the FPC 407. The potential of this counter electrode can be switched by the selection section 413 in order to apply the reverse bias.

Figure 4B:
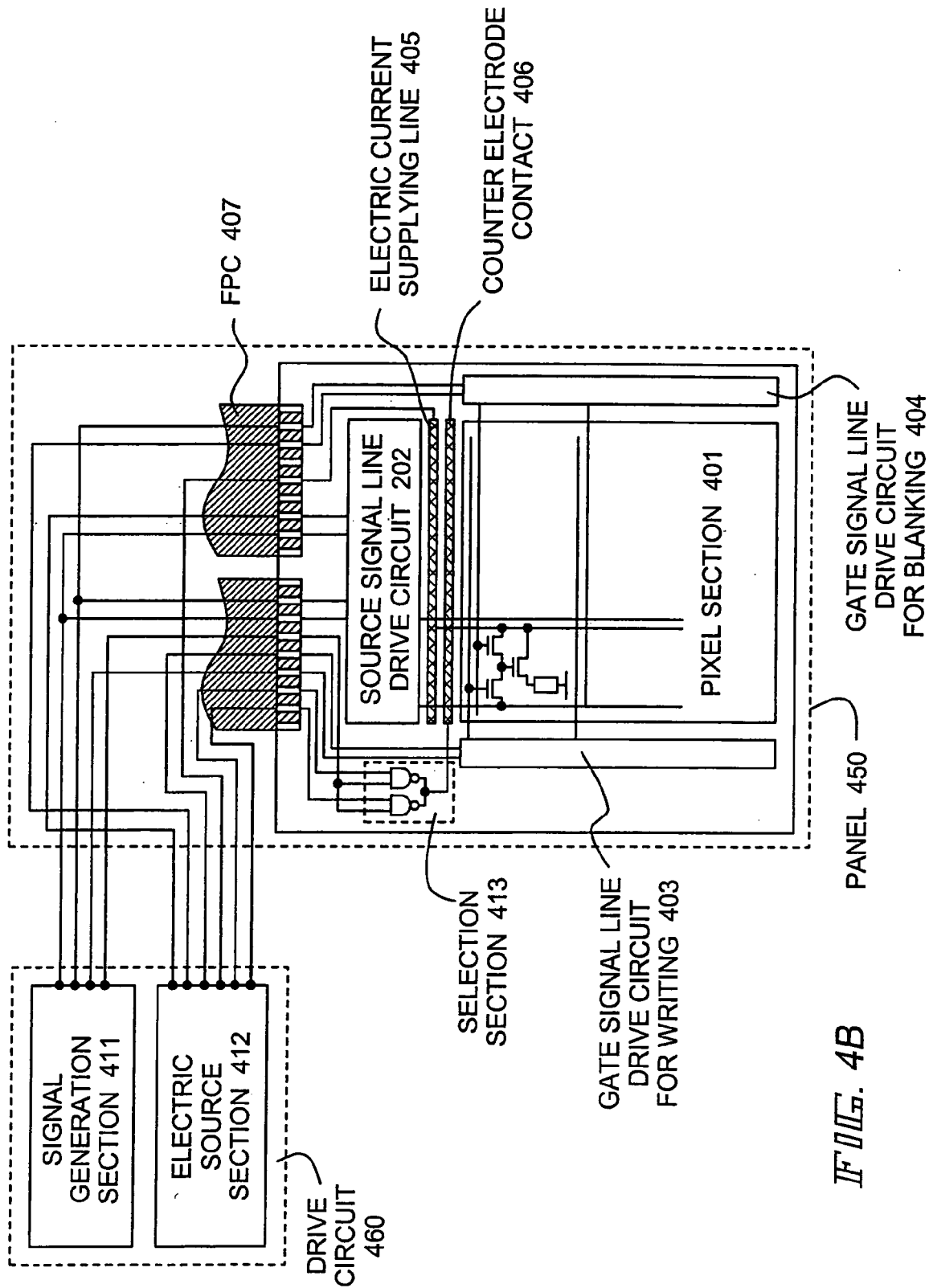

FIG. 4B is an example in which the selection section 413 is integrally formed on the panel 450.

Moreover, the panel 450, the selection section 413, the signal generation section 411 and the electric source section 412 may be also integrally formed on the substrate.

Example 2

Figure 5:
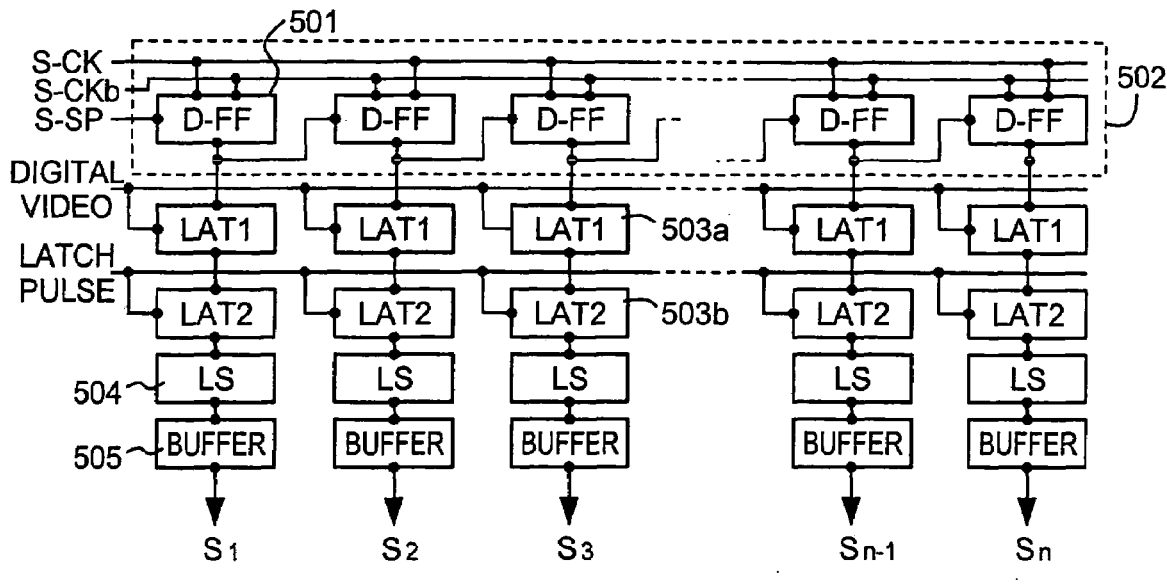
FIG. 5 is a diagram showing one example of configuration of a source signal line drive circuit.
Figure 6:
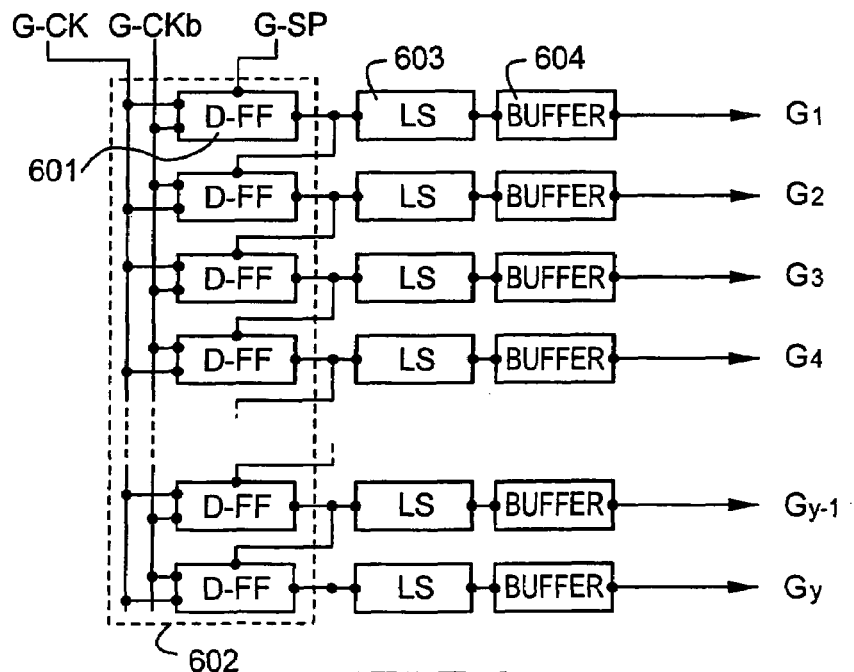
FIG. 6 is a diagram showing one example of configuration of a gate signal line drive circuit.

A schematic diagram of a source signal line drive circuit is shown in FIG. 5 and a schematic diagram of a gate signal line drive circuit is shown in FIG. 6 in the case where the display of the picture image is performed using a digital picture signal.

The source signal line drive circuit has a shift register 502 using a plurality of D-flip flops 501, a first latch circuit 503a, a second latch circuit 503b, a level shifter 504, a buffer 505 and the like. Signals inputted from the external are a clock signal (S-CK), an inversed clock signal (S-CKb), a start pulse (S-SP) and a digital picture signal (Digital Video Data). In the case of the configuration like FIG. 5, digital picture signals are inputted, for example, in such a way as "in the first bit, first line→second line→ . . . →final line; in the second bit, first line→second line→ . . . →final line; in the third bit, first line→second line . . . " in series.

First, according to the timings of a clock signal, a clock inverted signal and a start pulse, the sampling pulses are in turn outputted from the shift register 502. Subsequently, the sampling pulse is inputted into the first latch circuit 503a, takes in and maintains the digital picture signals of the respective rows at the timing that the sampling pulses have been inputted.

When the maintaining of the digital picture signal is completed in the first latch circuit 503a at the final stage, a latch pulse is inputted during the horizontal fly-back period, and in this timing, the digital picture signals maintained in the first latch circuit 503a are transmitted to the second latch circuit 503b at the same time. Then, in the level shifter, these are subjected to the conversion of the amplitude of the pulses, subsequently after the picture signal waveform has been shaped in the buffer, these are outputted to source signal lines S1-Sx.

On the other hand, the gate signal line drive circuit has a shift register 602 composed of a plurality of D-flip flops 601, a level shifter 603, a buffer 604 and the like. Signals inputted from the external are a clock signal (G-CK), an inversed clock signal (G-CKb) and a start pulse (G-SP).

First, according to the timings of a clock signal, a clock inversed signal, and a start pulse, pulses are in turn outputted from the shift register 602. Subsequently, these are subjected to the conversion of the amplitude of the pulse in the level shifter 603, and subsequently, after the pulse waveform has been shaped in the buffer, these are outputted to the respective gate signal lines as pulses for in turn selecting gate signal lines G1-Gy. When the selection on the final line Gy is terminated, after passing through the vertical fly-back period, again, the pulses are outputted from the shift register 602, and the selections of the gate signal lines are in turn performed.

Example 3

The actual driving timing in the case where the pixel configuration listed in Embodiment 1 is SES driven and the reverse bias is applied will be described below with reference to FIG. 1. FIGS. 1A and 1B show timing charts, FIG. 1C shows potential of the counter electrode, and FIG. 1D shows the pixel configuration.

As shown in FIG. 1A, one frame period is divided into four subframe periods SF1-SF4. The respective subframes have an address (writing) period Ta and a sustain (light emitting) period Ts. Moreover, in a subframe in which an address (writing) period Ta is longer than a sustain (light emitting) period Ts (where SF3 and SF4 are relevant), a blanking period Tr, a non-light emitting period Te and a reverse bias period Tb as well as the address (writing) period Ta and the sustain (light emitting) period Ts are provided.

The address (writing) period Ta is a period in which a digital picture signal is written in the pixel, the sustain (light emitting) period Ts is a period in which the display is performed by making the EL element in a light emitting state or in a non-light emitting state based on the digital picture signal written in the address (writing) period Ta. The light emitting time of each pixel per one frame period is determined depending upon the fact that in which subframe the EL element emits the light, and the gradation display is performed using the difference between these light emitting times.

The blanking period Tr is a period in which a signal for forcibly making the EL element into a non-light emitting state is inputted, the non-light emitting period Te is a period in which the EL element becomes in a non-light emitting state based on the signal inputted in the blanking period Tr. Moreover, the reverse bias period Tb is a period in which the reverse bias is applied to the EL element.

As for an operation, first, in an address (writing) period Ta1 of SF1, the pulses are in turn inputted into the gate signal line for writing 112 from the first line, a digital picture signal for the purpose of turning the TFT for switching 115 ON, turning the TFT for driving 117 ON and OFF is written in each pixel. On a line where the digital picture signal is written, it is immediately transferred to the sustain (light emitting) period Ts1. When the writing work is completed from the first line to the final line, the address (writing) period Ta1 is terminated. After the sustain (light emitting) period Ta1 has been terminated, again, the pulses are in turn inputted into the gate signal line for writing 112 from the first line, the address (writing) period Ta2 of SF2 is initiated, and transferred to the sustain (light emitting) period Ts2.

Subsequently, the address (writing) period Ta3 of SF3 is initiated. Here, since the sustain (light emitting) period Ts3 is shorter than the address (writing) period Ta3, immediately after the sustain (light emitting) period Ts3 has been terminated, it cannot transfer to the next address (writing) period Ta4. Therefore, when the sustain (light emitting) period Ts3 of the respective lines is terminated, the blanking period Tr 3 is initiated. In the blanking period Tr3, the pulses are in turn inputted from the first line to the gate signal line for blanking 113, the TFT for blanking 116 is turned ON, the light emitting of the EL element 118 is forcibly stopped, and thereinafter, it becomes a non-light emitting period Te3.

At this time, in the usual SES drive method, the length of a non-light emitting period is a period from the time when the sustain (light emitting) period of the first line is terminated to the time when the address (writing)-period of the final line is terminated. In a non-light emitting period Te, since the potential of the gate electrode of the TFT for driving 117 is maintained, the TFT for driving 117 continues to be in an OFF state.

After the non-display period Te3 has been terminated, it is transmitted to the reverse bias period Tb3. Since in the reverse bias period Tb3, the potential of the counter electrode is changed as shown in FIG. 1 C, after the blanking period Tr3 is terminated, the non-light emitting period Te3 is extended more than that at the time when the usual SES drive is performed, which is necessary to provide it during the foregoing non-light emitting period.

In the reverse bias period Tb3, the potential of the counter electrode is heightened more than the potential of the pixel electrode and the reverse bias is applied to the EL element 118 by switching the switch 120 from the Vc1 to Vc2.

At the time when the desired reverse bias period Tb3 has been terminated, the potential of the counter electrode is switched from Vc1 to Vc2. At the same time, the next address (writing) period Ta4 is initiated. Hereinafter, the similar operation as SF3 is repeated, when the SF4 is terminated, one frame is terminated, and transferred to the next frame.

Figure 1D:
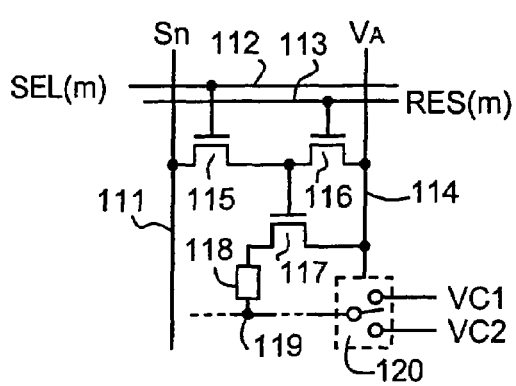
Figure 1E:
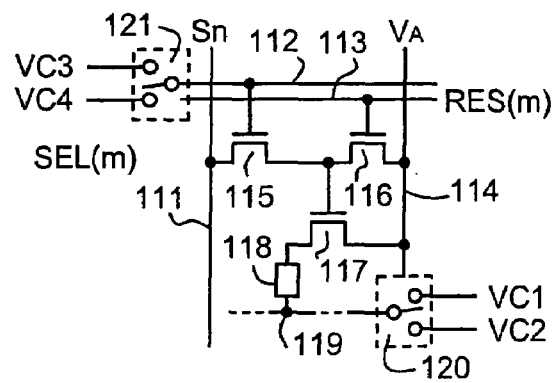
Figure 2:
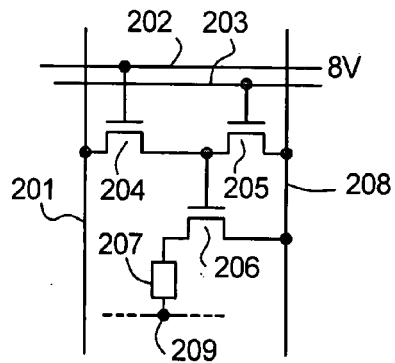
FIG. 2 is a diagram showing a pixel configuration of a light emitting device configured using three transistors.

Moreover, in FIG. 1D, a condenser is not shown between the gate electrode of the TFT for driving 117 and the electric current supplying line 114, but a condenser which maintains the potential of the gate electrode of the TFT for driving 117 for a certain time may be provided. Moreover, if the channel capacitance of the TFT for driving 117 is sufficient, it is not necessary to provide the condenser. Moreover, the configuration of the gate signal line drive circuit for blanking is changed, and in a non-light emitting period, it may be made as a voltage between the gate and the source so that the TFT for driving 117 is securely turned OFF.

Moreover, here, although only in the subframe in which the address (writing) period Ta is longer than the sustain (light emitting) period Ts, a blanking period Tr, a non-light emitting period Te and a reverse bias period Tb are provided, also in the subframe in which the address (writing) period Ta is shorter than or equal to the sustain (light emitting) period Ts, the respective periods are provided, the reverse bias may be applied to the EL element.

Moreover, in FIG. 1A, after the blanking period Tr has been completely terminated until the final line, the reverse bias period Tb was initiated, but as shown in FIG. 1B, the final line of the blanking period Te and the initiation of the reverse bias application period Tb3 are overlapped with each other, and a better duty rate can also be obtained.

Example 4

The gate signal line drive circuit for writing will be described with reference to FIG. 8A and the pixel configuration will be described with reference to FIG. 8B in the case where the pixel configuration listed in Embodiment 2 is SES driven and the reverse bias is applied.

Figure 8A:
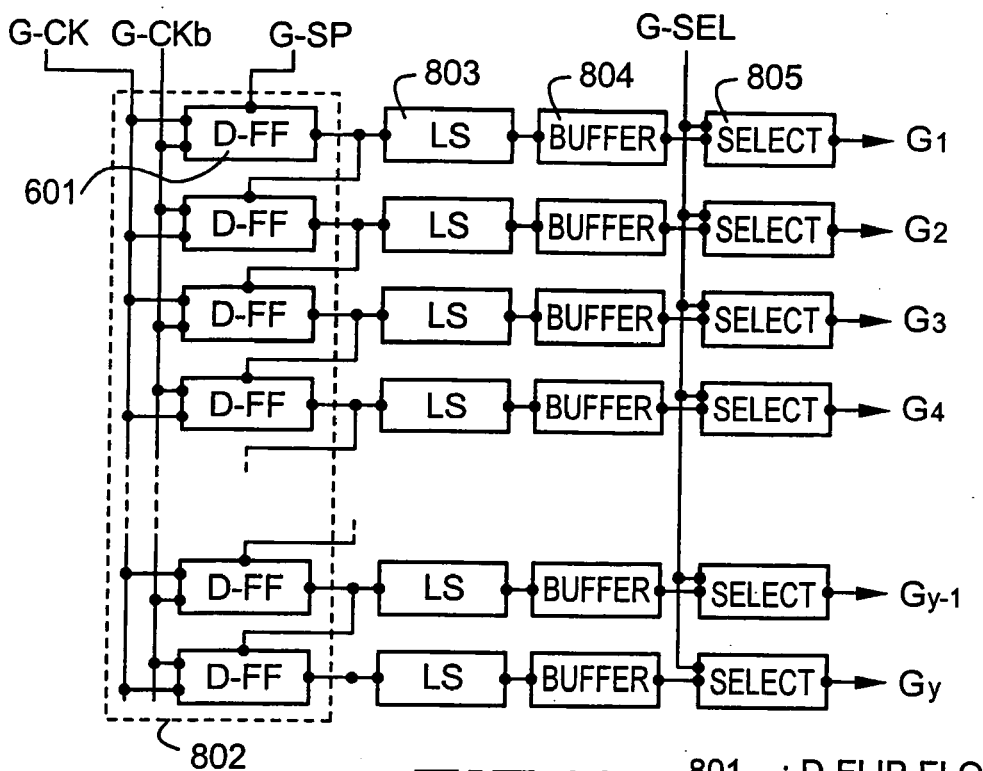
FIGS. 8A and 8B are diagrams showing an example of configuration of a gate signal line drive circuit.

The gate signal line drive circuit of FIG. 8A has a shift register 802 composed of a plurality of stages of D-flip flops 801, a level shifter 803, a buffer 804, a selection circuit 805 and the like. Signals inputted from the external are a clock signal (G-CK), an inversed clock signal (G-CKb), a start pulse (G-SP), and a select signal (G-SEL). A switch 821 shown in FIG. 8A corresponds to the selection circuit 805 in FIG. 8B.

First, in the forward bias period, according to the timings of a clock signal, a clock inversed signal and a start pulse, the pulses are in turn outputted from the shift register 802. Subsequently, it is subjected to the conversion of amplitude of the pulse by the level shifter 803, subsequently, after a pulse waveform has been shaped in the buffer, it is inputted into the selection circuit 805. In the selection circuit 805, the output pulses from the buffer 804, which have been selected by a select signal are in turn outputted to the gate signal lines for writing G1-Gy. When the selection is terminated on the final line Gy, after these have passed through the vertical fly-back period, pulses are again outputted from the shift register 802, and the gate signal lines are in turn selected.

Moreover, in the reverse bias period, a select signal is switched, and regardless of the buffer output, the potential at which the TFT for switching 815 is turned ON is outputted to the gate signal lines for writing G1-Gy at the same time. At this time, the potential of L level has been inputted into all of the rows of source signal lines 811. Hence, the TFT for switching 815 of all the pixels are turned ON at the same time, the potential of L level is inputted to the gate electrode of the TFT for driving 817, and the TFT for driving 817 is turned ON. By turning the TFT for driving 817 ON, the potential of the electric current supplying line 814 is inputted to the pixel electrode.

In the reverse bias period, since the potential of the counter electrode 819 is switched from Vc1 to Vc2, the potential of the counter electrode 819 becomes higher than the potential of the pixel electrode and the reverse bias is applied to the EL element.

Example 5

Figure 7A:
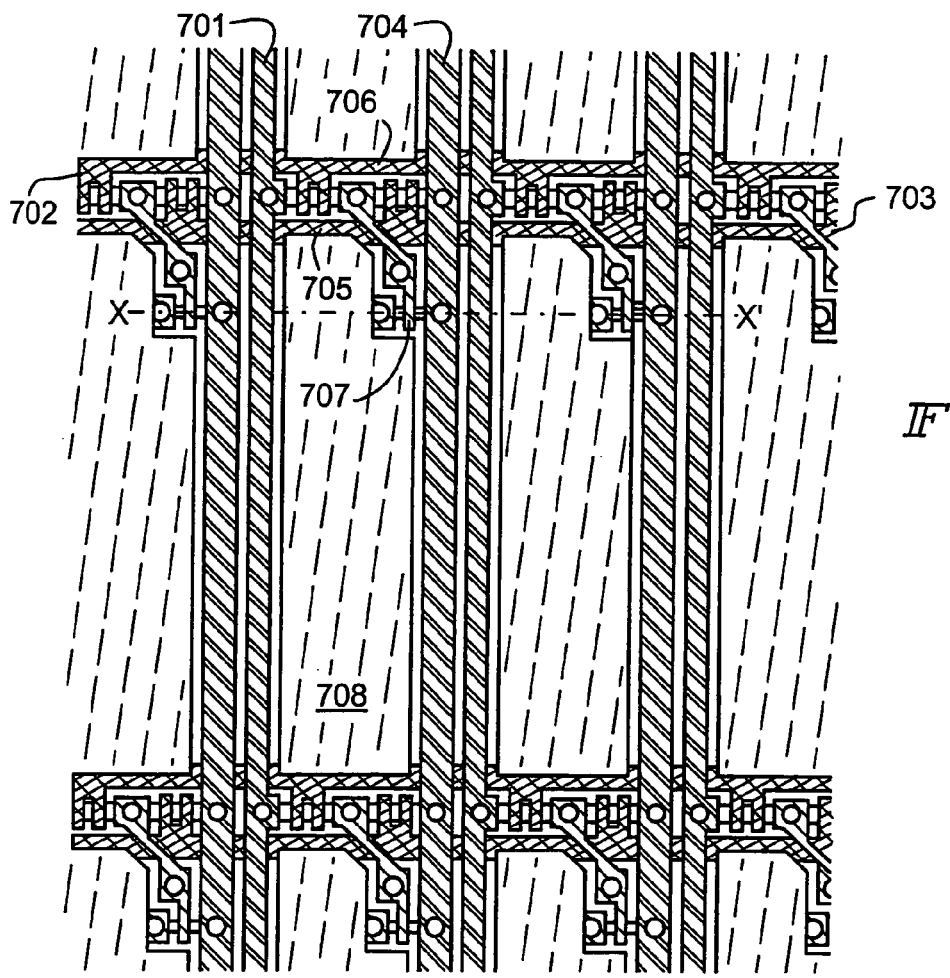
FIGS. 7A and 7B are examples showing an element layout of a pixel section and its cross section.
Figure 7B:
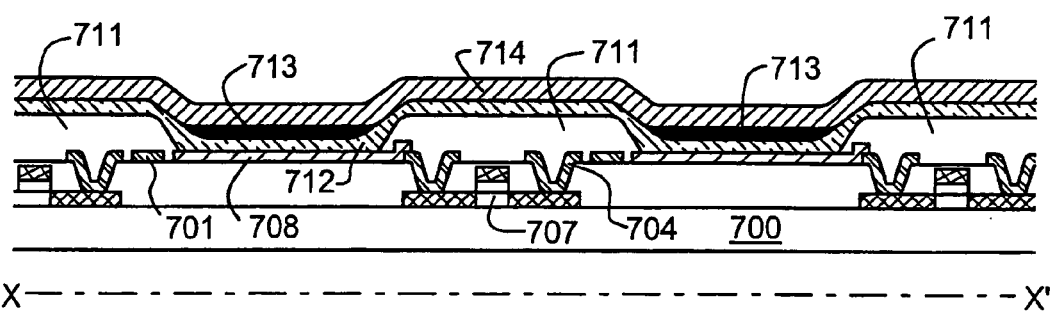
Figure 8B:
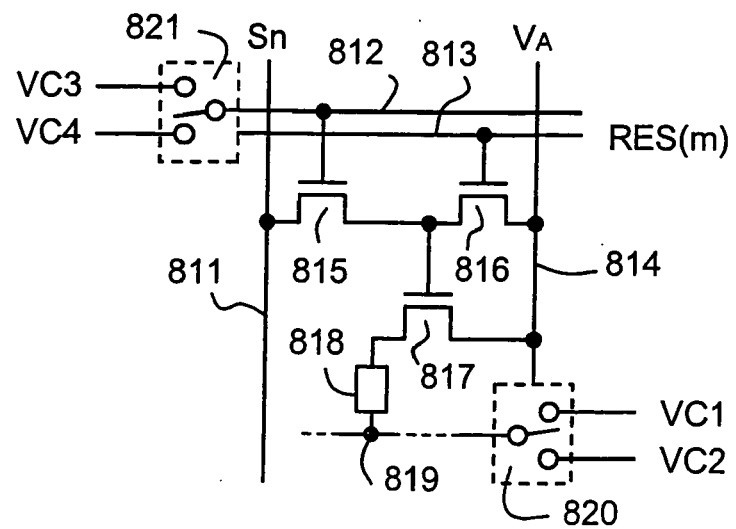

FIG. 7A shows that an example of element layout in the case that pixels having structures of FIG. 1D, 8B shown in Embodiments 1, 2 are actually formed. Further, FIG. 7B shows a cross-sectional view of FIG. 7A taken along the line X-X'.

In FIG. 7A, reference numeral 700 is a substrate having an insulating surface. A driving TFT 707 is formed on a substrate 700. Then, source and drain electrodes made from wiring materials are formed to connect with impurity regions, which form source and drain regions of the driving TFT 707. Either is formed to connect with a pixel electrode 708 on the overlapping portions. An organic conductive film 712 is formed on the pixel electrode 708, and an organic thin film (light emitting layer) 713 is formed thereon. An opposite electrode 714 is formed on the organic thin film (light emitting layer) 713. The opposite electrode 714 is formed all over the surface so as to connect uniformly with all pixels.

In this specification, reference as "EL element" means a laminated layer including the pixel electrode 708, the organic conductive film 712, the organic thin film (light emitting layer) 713, and the opposite electrode 714 in FIG. 7B. Either the pixel electrode 708 and the opposite electrode 714 is an anode, or the other is a cathode.

Light generated at the light thin film (light emitting layer) 713 radiates through either the pixel electrode 708 or the opposite electrode 714. In FIG. 7B, when light is emitted downward through the pixel electrode side or the side having TFT and the like, it is referred to as a bottom emission structure. When light is emitted upward through the opposite electrode side, it is referred to as a top emission structure.

In the case of the bottom emission structure, the pixel electrode 708 is made from a transparent conductive film. In the case of the top emission structure, the opposite electrode 714 is made from a transparent film.

The structure shown in this example is illustrative only. A lamination order of a pixel layout, a cross-sectional structure, and the electrode of EL elements are not to be considered limited to this structure.

In the light emitting element for color display, EL elements for R, G, B color may be deposited separately. Otherwise, monochromatic EL elements may be formed so that the structure achieves R, G, B color by color filters.

Example 6

In the present Example, a macromolecular compound is applied as a light emitting layer, and further, in a light emitting element in which a buffer layer consisting of an electrically conductive macromolecular compound is provided between the anode and the light emitting layer, the results that the measurement on the brightness deterioration at the time when the direct current drive (forward bias is always applied) and the alternate current drive (forward bias and reverse bias are alternately applied in a certain cycle) will be described below.

Figure 3A:
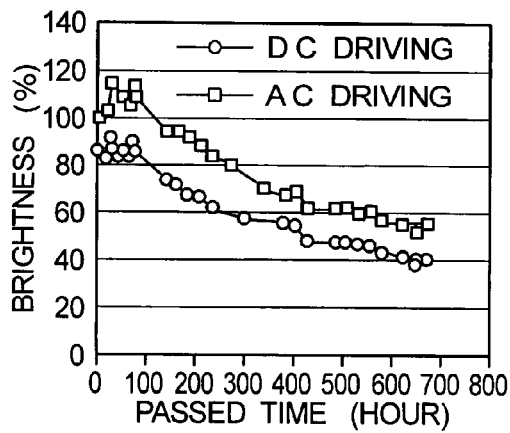
FIGS. 3A to 3D are graphical representations showing the reliability test results of an EL element.
Figure 3B:
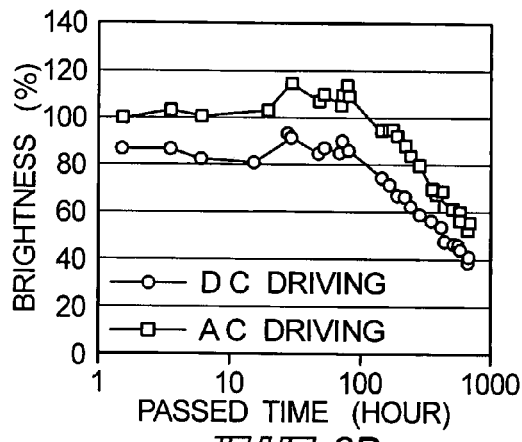

FIGS. 3A and 3B show the results of the reliability test when the alternate drive has been carried out at the forward bias; 3.7 V, the reverse bias; 1.7 V, duty ratio; 50% and alternate current frequency; 60 Hz. FIG. 3A is a graphical representation using a linear scale, and FIG. 3B is a graphical representation using a LOG scale. The initial brightness has been about 400 cd/cm$^2$. For the purpose of comparing, the results of the reliability test at the time when the direct current drive (forward bias; 3.65 V) has been carried out are also shown at the same time. As a result, in the direct current drive, the brightness has been reduced by half at about 400 hours, in contrast to this, in the alternate current drive, even after about 700 hours have passed, the initial brightness have not been reduced by half.

Figure 3C:
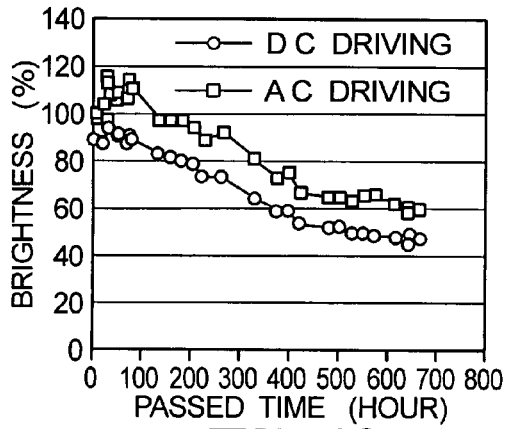
Figure 3D:
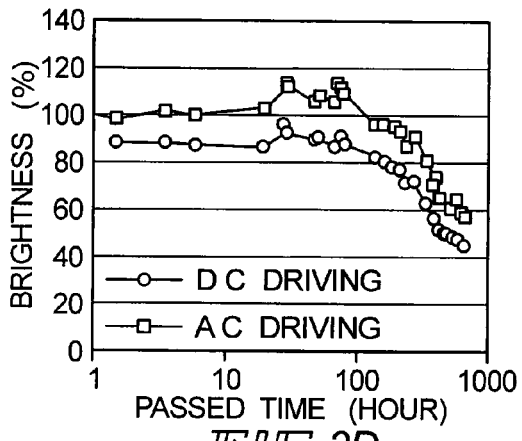

FIGS. 3C and 3D show the results of the reliability test at the time when the alternate current drive has been carried out at the forward bias; 3.8 V, the reverse bias; 1.7 V, duty ratio; 50% and alternate current frequency; 600 Hz. FIG. 3C is a graphical representation using a linear scale, and FIG. 3D is a graphical representation using a LOG scale. The initial brightness has been about 300 cd/cm$^2$. For the purpose of comparing, the results of the reliability test at the time when the direct current drive (forward bias; 3.65 V) has been carried out are also shown at the same time. As a result, in the direct current drive, the brightness has been reduced by half at about 500 hours, in contrast to this in the alternate current drive, about 60% of the initial brightness was maintained even after about 700 hours have passed.

Example 7

Since the light emitting device using a light emitting element is a self-luminous type light emitting device, when comparing to a liquid display, the visibility is more excellent at the bright place, and the visual field is wider. Therefore, it can be used for the display part of a variety of electronic apparatuses.

As an electronic apparatus in which a light emitting device of the present invention is used, a television, a video camera, a digital camera, a goggle type display (head mount display), a navigation system, an audio system (car audio, audio component and the like), a notebook sized personal computer, a game machine, a handheld terminal (mobile computer, cellular phone, portable type game machine, electronic book or the like), an image reproduction device equipped with a recording medium (device equipped with a display capable of reproducing the recording medium, concretely, such as an image Digital Versatile Disc (DVD)) and the like are listed. Particularly, in the case of handheld terminals in which the occasions of seeing the screen from the slanting angle are frequent, since the width of the visual field is considered to be important, it is desirable to use a light emitting device. Concrete examples of these electric devices are shown in FIG. 10.

Figure 10A:
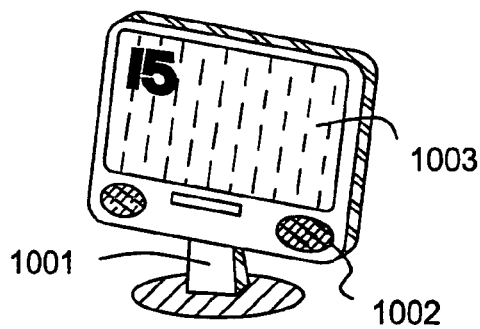
FIGS. 10A to 10E are drawings showing examples of electronic apparatuses to which the present invention can be applied.

FIG. 10A is an EL display, including a case 1001, an audio output part 1002, a display part 1003 and the like. A light emitting device of the present invention can be used in the display part 1003. Since the light emitting device is a self-luminous type light emitting device, the back light is not required, whose display part can be made thinner than a liquid display. It should be noted that the light emitting element display device includes all kinds of display devices for information display such as a display for personal computer, a display for receiving TV broadcast, a display for advertising and the like.

Figure 10B:
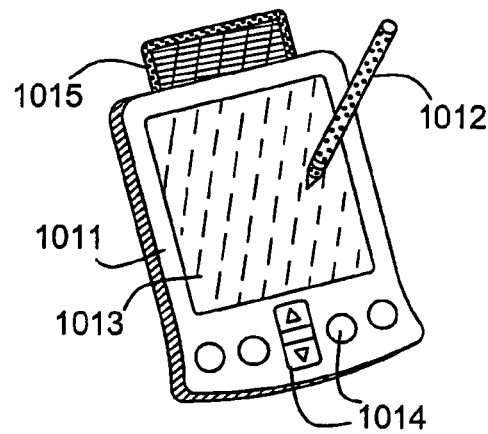
Figure 10C:
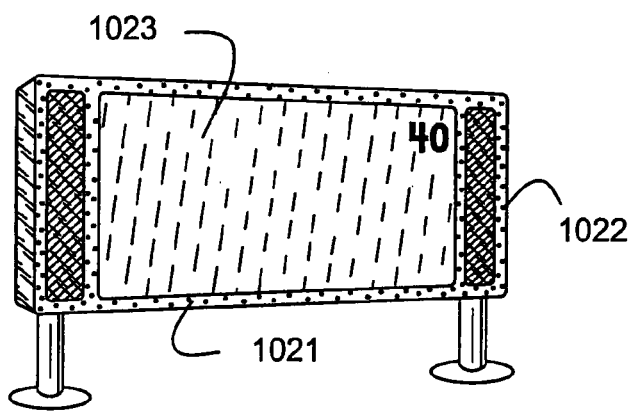

Moreover, FIG. 10C shows a large EL display, and includes a case 1021, an audio output part 1022 and a display part 1023, as similar to FIG. 10A. A light emitting device of the present invention can be used in the display part 1023.

FIG. 10B shows a mobile computer, including a main body 1011, a stylus 1012, a display part 1013, an operation bottom 1014, an external interface 1015 and the like. A light emitting device of the present invention can be used in the display 1013.

Figure 10D:
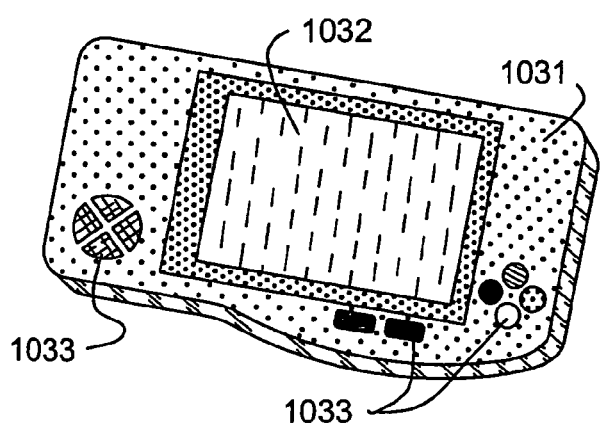

FIG. 10D shows a game machine, including a main body 1031, a display part 1032, an operation bottom 1033 and the like. A light emitting device of the present invention can be used in the display part 1032.

Figure 10E:
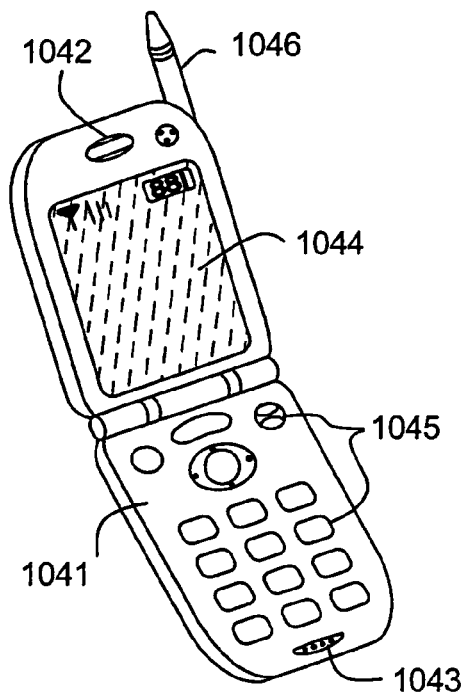

FIG. 10E shows a cellular phone, including a main body 1041, an audio output part 1042, an audio input part 1043, a display part 1044, an operation switch 1045, an antenna 1046 and the like. A light emitting device of the present invention can be used in the display part 1044. It should be noted that the display part 1044 could suppress the consumption of electric current of the cellular phone by displaying a white letter on the black background.

It should be noted that when the luminous brightness of an organic light emitting material will be enhanced in the future, the light containing outputted image information is enlarged and projected using a lens or the like and is capable of being used for a projector of front type or rear type.

Moreover, the above-described electronic apparatuses frequently have displayed information delivered through an electronic communication line such as the internet, CATV (cable TV) and the like, particularly, the occasions for displaying a dynamic picture information has been increased. Since response rate of an organic luminescent material is very high, it is preferable to use a light emitting device for dynamic display.

Moreover, since the colors are brilliant, it is also suitable for a realistic large screen television.

Moreover, since as for a light emitting device, the portion where the light emits consumes the electric power, it is desirable to display information in the way that the light emitting portion is reduced to the small portion. Therefore, in the case where a light emitting device is used in the display part in which information using characters is mainly used such as a handheld terminal, particularly, a cellular phone, an audio system, it is desirable to drive so that information using characters is formed by the light emitting portion using the non-light emitting portion as its background.

As described above, the application range of the present invention is extremely wide, the present invention is capable of being used for electronic apparatuses in any field. Moreover, as for an electronic apparatus of the present Example, light emitting devices of any configuration shown in Examples 1-5 may be used.

According to a light emitting device of the present invention, in a SES drive method, the reliability can be enhanced by applying the reverse bias to an EL element driven at the constant electric current. Moreover, the application of the reverse bias is performed by changing only the counter electrode, and withstand voltage of TFT and the increase of the consumption electric power due to the increase of voltage of the gate signal line drive circuit which is to be a problem at the time when the electric current supplying line is greatly changed, can be suppressed. Furthermore, the reduction of the electric power consumption is performed while the enhancement of the reliability is secured by making the reverse bias smaller than the forward bias. Moreover, the increase of the number of electric sources can also be suppressed by making the potential at the time when the reverse bias is applied be in common with the potential of the electric source of the source signal line drive circuit or the gate signal line drive circuit.

What is claimed is:

1. A light emitting device comprising:
a switching transistor provided in a pixel and over a substrate;
a driving transistor provided in said pixel and over said substrate;
a blanking transistor provided in said pixel and over said substrate;
a pixel electrode provided in said pixel and over said substrate;
a counter electrode provided over said substrate;
an electroluminescence element provided in said pixel and comprising a light emitting layer, said light emitting layer provided over said substrate and between said pixel electrode and said counter electrode; and
a switch connected with said counter electrode for switching a potential of said counter electrode from one of a first potential and a second potential to the other,
wherein the driving transistor comprises an active layer and a gate electrode, and
wherein the blanking transistor controls connection between the active layer and the gate electrode.

2. A device according to claim 1 wherein said light emitting device is incorporated into one selected from the group consisting of a cellular phone, an EL display, a mobile computer and a game machine.

3. A device according to claim 1 wherein one of a source and a drain of said switching transistor is connected with a gate electrode of said driving transistor.

4. A device according to claim 1 wherein one of a source and a drain of said driving transistor is connected with said pixel electrode.

5. A device according to claim 1 wherein one of a source and a drain of said blanking transistor is connected with a gate electrode of said driving transistor.

6. A device according to claim 1 wherein the active layer comprises a first region and a second region, and the blanking transistor controls connection between the gate electrode and the first region.

7. A light emitting device comprising:
a switching transistor provided in a pixel and over a substrate;
a driving transistor provided in said pixel and over said substrate;
a blanking transistor provided in said pixel and over said substrate;
a pixel electrode provided in said pixel and over said substrate;
a counter electrode provided over said substrate;
an electroluminescence element provided in said pixel and comprising a light emitting layer, said light emitting layer provided over said substrate and between said pixel electrode and said counter electrode; and
a switch connected with said counter electrode for switching a potential of said counter electrode from one of a first potential and a second potential to the other,
wherein said first potential is applied to said counter electrode to apply a forward bias voltage between said pixel electrode and said counter electrode, and said second potential is applied to said counter electrode to apply a reverse bias voltage between said pixel electrode and said counter electrode, and
wherein said reverse bias voltage has polarity inversed with respect to said forward bias voltage,
wherein the driving transistor comprises an active layer and a gate electrode, and
wherein the blanking transistor controls connection between the active layer and the gate electrode.

8. A device according to claim 7 wherein said light emitting device is incorporated into one selected from the group consisting of a cellular phone, an EL display, a mobile computer and a game machine.

9. A device according to claim 7 wherein one of a source and a drain of said switching transistor is connected with a gate electrode of said driving transistor.

10. A device according to claim 7 wherein one of a source and a drain of said driving transistor is connected with said pixel electrode.

11. A device according to claim 7 wherein one of a source and a drain of said blanking transistor is connected with a gate electrode of said driving transistor.

12. A device according to claim 7 wherein the active layer comprises a first region and a second region, and the blanking transistor controls connection between the gate electrode and the first region.

13. A light emitting device comprising:
a switching transistor provided in a pixel and over a substrate;
a driving transistor provided in said pixel and over said substrate;
a blanking transistor provided in said pixel and over said substrate;
a pixel electrode provided in said pixel and over said substrate;
a counter electrode provided over said substrate;
an electroluminescence element provided in said pixel and comprising a light emitting layer, said light emitting layer provided over said substrate and between said pixel electrode and said counter electrode;
a switch provided over said substrate and connected with said counter electrode for switching a potential of said counter electrode from one of a first potential and a second potential to the other;

a source signal line drive circuit provided over said substrate;

a gate signal line drive circuit for writing provided over said substrate; and a gate signal line drive circuit for blanking provided over said substrate.

14. A device according to claim 13 wherein said light emitting device is incorporated into one selected from the group consisting of a cellular phone, an EL display, a mobile computer and a game machine.

15. A device according to claim 13 wherein one of a source and a drain of said switching transistor is connected with a gate electrode of said driving transistor.

16. A device according to claim 13 wherein one of a source and a drain of said driving transistor is connected with said pixel electrode.

17. A device according to claim 13 wherein one of a source and a drain of said blanking transistor is connected with a gate electrode of said driving transistor.

18. A light emitting device comprising:

a switching transistor provided in a pixel and over a substrate;

a driving transistor provided in said pixel and over said substrate;

a blanking transistor provided in said pixel and over said substrate;

a pixel electrode provided in said pixel and over said substrate;

a counter electrode provided over said substrate;

an electroluminescence element provided in said pixel and comprising a light emitting layer, said light emitting layer provided over said substrate and between said pixel electrode and said counter electrode;

a switch provided over said substrate and connected with said counter electrode for switching a potential of said counter electrode from one of a first potential and a second potential to the other;

a source signal line drive circuit provided over said substrate;

a gate signal line drive circuit for writing provided over said substrate;

a gate signal line drive circuit for blanking provided over said substrate;

a signal generation section provided over said substrate; and an electric source section provided over said substrate.

19. A device according to claim 18 wherein said light emitting device is incorporated into one selected from the group consisting of a cellular phone, an EL display, a mobile computer and a game machine.

20. A device according to claim 18 wherein one of a source and a drain of said switching transistor is connected with a gate electrode of said driving transistor.

21. A device according to claim 18 wherein one of a source and a drain of said driving transistor is connected with said pixel electrode.

22. A device according to claim 18 wherein one of a source and a drain of said blanking transistor is connected with a gate electrode of said driving transistor.

* * * * *